United States Patent [19]

Mino et al.

[11] Patent Number: 4,783,390

[45] Date of Patent: Nov. 8, 1988

[54] MULTICOLOR DIAZO IMAGE-FORMING MATERIAL

[75] Inventors: Hisashi Mino, Saitama; Norio Yabe; Takeshi Iijima, both of Higashimatsuyama, all of Japan

[73] Assignee: Sanyo-Kokusaku Pulp Co., Ltd., Tokyo, Japan

[21] Appl. No.: 32,687

[22] Filed: Apr. 1, 1987

Related U.S. Application Data

[62] Division of Ser. No. 738,720, May 29, 1985, Pat. No. 4,670,371.

[30] Foreign Application Priority Data

Aug. 1, 1983 [JP] Japan ................... 58-140912

[51] Int. Cl.[4] .................... G03C 1/60; G03C 1/56; G03C 7/00; G03C 7/26
[52] U.S. Cl. .................... 430/156; 430/143; 430/145; 430/160; 430/162; 430/175; 430/176; 430/293
[58] Field of Search ............ 430/156, 160, 162, 175, 430/176, 143, 142, 145, 293, 294, 302

[56] References Cited

U.S. PATENT DOCUMENTS

| | | | |
|---|---|---|---|
| 2,871,119 | 1/1959 | Weegar et al. | 430/176 |
| 3,046,120 | 7/1962 | Schmidt et al. | 430/190 |
| 3,136,637 | 6/1964 | Larson | 430/175 |
| 3,258,337 | 6/1966 | Cousins | 430/293 |
| 3,849,138 | 11/1974 | Wyckoff | 430/142 |
| 4,217,407 | 8/1980 | Watanabe et al. | 430/156 |
| 4,258,125 | 3/1981 | Ehlund | 430/159 |

FOREIGN PATENT DOCUMENTS

| | | | |
|---|---|---|---|
| 2614747 | 10/1977 | Fed. Rep. of Germany | 430/142 |
| 119130 | 9/1981 | Japan | 430/145 |

OTHER PUBLICATIONS

Schreiber, D. D. et al., *Research Disclosure*, 3/1975, pp. 53–56.

*Primary Examiner*—Charles L. Bowers, Jr.
*Attorney, Agent, or Firm*—Armstrong, Nikaido, Marmelstein & Kubovcik

[57] ABSTRACT

A multi-color image forming material which is in the form of multiple layers on a support, and having, at least two photosensitive layers, the farthest layer from the support being the uppermost photosensitive layer, the photosensitive layers being formed from a water-soluble resin having photocrosslinking ability with diazo resin, a photosensitive water-soluble, organic solvent insoluble diazo resin, and a water dispersible coloring agent which can produce a color tone, each photosensitive layer having a coloring agent which can produce a different color tone; and at least one intermediate layer, each intermediate layer being positioned between each photosensitive layer and the next adjacent photosensitive layer, the intermediate layer being formed from a hydrophobic, water-resistant, organic solvent softenable resin.

1 Claim, No Drawings

MULTICOLOR DIAZO IMAGE-FORMING MATERIAL

This is a division of application Ser. No. 738,720, filed May 29, 1985, now U.S. Pat. No. 4,670,371.

DETAILED DESCRIPTION OF THE INVENTION

The present invention relates to a multicolor image-forming material and image-forming method which is capable of forming the negative multicolor image. The process is usable in the fields of drafting for the design, plate-making for the printing, etc., wherein, through an intermediate layer comprising a hydrophobic, water-resistant and organic solvent-softenable resin, diazo resin-water-soluble resin type photosensitive layers containing coloring agent are coated in multiple layers on a supporter provided with adhesive treatment, if need be. Varying color tones of coloring agent are provided in every photosensitive layer, and the pattern exposure, the immersion into the organic solvent to soften the resin in the intermediate layer, the washing with water to remove the non-exposed area of the photosensitive layer together with the upper intermediate layer thereof without removing the area having, the image already been formed on the upper layer thereof, and the drying are carried out repeatedly on every photosensitive layer unit.

Up to this time, in the field of drafting for design, there has been such a method of using multicolor image-forming material as an architectural draft for the design and the plan, for example, black-lined arrangement of the rooms, blue-linedlaying of the water pipes, yellow-lined wiring for the electrical system and red-lined laying of the gas pipes are recorded by superposing on a sheet of film. Also, in the field of platemaking for the printing, because of a trend to print, for example, the study-aid books for learning etc. with red-colored and blue-colored letters for the purpose of emphasizing the important portions, there has been a using method of using multicolor image-forming material for proofing the multi-color letters.

Currently, the following methods for forming the multicolor image are used for the purposes described above.

(1) Surprint method

The multicolor image is formed in such a manner that a photosensitive liquor containing the pigments of respective colors are coated rotationally or with Wipon system on a sheet of supporter and, after the exposure, the soluble area is removed with a developing fluid, or the solution of photosensitive agent having a property such that it loses adhesiveness after irradiation with light is coated on the substrate by the throwing-on method and, after the exposure, the color toner is allowed to adhere to the non-exposed area where the adhesiveness still remains to form the separated color image, and coating of the photosensitive liquor and development are repeated thereon.

(2) Overlay method

The multicolor image is formed by superposing separated images on one another. The image are obtained by exposure and development with ammonia gas or the wet development of diazo photosensitive material coated on the transparent film. Image may also be prepared by dissolving out to remove the soluble area with developing fluid, after exposing the transparent film coated beforehand with the diazo resin etc. containing the pigment of respective colors.

However, conventional methods as these have the problems as follows:

In the method (1), the user of the image-forming material has to practice the preparation of the photosensitive liquor, coating and drying by himself and devices for those are also necessary. Therefore, the workability and the economical aspect are inferior. In the method (2), amendability by retouching is difficult since only the transparent film base can be used. Moreover, in this method, the procedure becomes complicated since many film bases should be superposed. Furthermore, the discoloration and the fading of the image becomes problematic in the case of the diazo photosensitive material.

As a result of putting forward the diligent studies on the novel multicolor image-forming material which can overcome the problems accompanied with the conventional methods described above, the inventors have found a phenomenon which enables them to obtain an excellent negative multicolor image by submitting a photosensitive layer of image-forming material to pattern exposure through an upper intermediate layer thereof, by immersing into an organic solvent which does not dissolve the components in the photosensitive layer but softens the resin in the intermediate layer before and after the photocrosslinking reaction, and by washing with water of ordinary temperature jetting out from a pressurized nozzle. The washing removes the non-exposed area (non-image area) of the photosensitive layer lying under the intermediate layer in direct contact therewith together with the upper intermediate layer thereof, but does not remove the image area having already been formed on the intermediate layer thereof. The image-forming material is provided thereby in a manner so that, through the intermediate layer comprising hydrophobic, water-resistant and organic solvent-softenable resin, diazo resin-water-soluble resin type photosensitive layers are coated in multiple layers on the supporter in varying color tones of the cooring agent in every photosensitive layer.

The occurence of this phenomenon, that the intermediate layer is removed, may be due to the fact that, when immersed in the organic solvent described above, the resin in the intermediate layer is softened into to be a state which is capable of being removed, but the area wherein the image having been formed on the upper layer thereof, is not removed since the hydraulic pressure does not affect directly on the intermediate layer due to the presence of the image. Moreover, if the pigment is added to the intermediate layer beforehand, there occurs a phenomenon wherein the penetrability of the organic solvent described above is increased and the easy softening thereby enables the removability to be enhanced further by the hydraulic pressure.

The non-exposed area of the photosensitive layer lying under the intermediate layer in direct contact therewith which has no image on the upper layer thereof and the surface of which is bared is able to be removed easily with water. Therefore, if the upper layer thereof is softened by the organic solvent and brought into a state capable of allowing water to penetrate easily, the non-exposed area of said photosensitive layer can be removed easily by the hydraulic pressure together with the upper intermediate layer thereof. When the upper photosensitive layer is subjected to exposure, the lower photosensitive layer is also exposed to the active rays transmitted through the upper layer. Therefore, the area is not easily removed with water due to an increase in the water-resistance. Besides, if the organic solvent described above dissolves the resin in the intermediate layer strongly, the resin in the intermediate layer is dissolved during the treatment for image formation of the lower photosensitive layer resulting in the washing away of the upper image. For this reason, it is preferable that the resin in the intermediate layer is not dissoluable or has low dissoluability with the organic solvent and the softening property is be high Applying the above-mentioned phenomenon, the present invention provides a multicolor image-forming material coated on a sheet of supporter with the photosensitive layers so that images of respective colors are to be formed, and the image-forming method in which exposure, immersion into organic solvent, washing for the removal, and drying are repeated using this multicolor image-forming material.

In the following, the invention is illustrated in detail based on examples.

As the supporters usable in the invention, plastic films such as polyethylene terephthalate, polypropylene, polyethylene, polyvinyl chloride, polystyrene, polycarbonate, triacetate, etc., glass plate, papers made water-resistant by laminating on both sides with polyethylene, polypropylene, etc., and the like can be mentioned.

Moreover, in order to give writing quality by pencil, Indian ink, ball pen, etc. on one side or both sides, plastic films with drafting quality such as sand mat film by the sand-blasting method, chemical mat film having a treated surface with a coating mixture formulated with additives such as dye, pigment, filler, etc. into the binder, etching mat film etched with alkali, etc., opacified film kneaded the white pigment, and the like can also be employed. The thickness of the supporter is suitable to be about 50 to 150$\mu$, though not limited particularly.

Although the photosensitive layer may be coated directly on these supporters, it is desirable to use corona discharge treatment, coating with a primer treatment agent or adhesive treatment or these combined beforehand in order to improve the adhesiveness. The choice of primer treatment agents is dependent upon the supporter. Suitable choices include phenol resin, polyester resin, urethane resin, copolymer of vinylidene chloride with vinyl acetate, copolymer of vinylidene chloride with acrylonitrile, etc. These can be used on the supporter with a coated film thickness of 0.1 to 2.0$\mu$ preferably. In particular, when sand mat film and chemical mat film are used as the supporters, it is preferable to conduct the coating of the aforementioned primer treatment agent in order to strengthen the adhesiveness between the mat layer and the photosensitive layer and to prevent greasing, in other words, the adsorption of diazo resin, coloring agent, etc. used in the photosensitive layer.

The photosensitive layer used for the invention comprises water-soluble resin having photocross-linking ability with diazo resin, the diazo resin and the coloring agent. As water-soluble resins having the photocrosslinking ability with diazo resin, a large number of materials, for example, polyvinyl alcohol, gelatin, casein, glue, alginate, gums, cellulose derivatives such as carboxymethylcellulose, hydroxyethylcellulose, etc., polyacrylic acid and salts thereof, polymethacrylic acid and salts thereof, polyacrylamide, polyethylene oxide, polyvinylpyrrolidone, and the like can be mentioned. All of these are possible to be used, if not dissolved into the solvent used for the coating of the intermediate layer and the organic solvent which softens the resin in the intermediate layer before and after the photocrosslinking reaction. However, as a result of putting forward the diligent investigations in consideration of photocrosslinking reactivity, development property, preservative stability, strength of the coated film and water-resistance after the photocrosslinking reaction, safety, width of the range in the selection of organic solvent which satisfies the above-mentioned conditions, and the like, in particular, polyvinyl alcohol, polyacrylamide and copolymers thereof have been found to be excellent when used independently or as a mixture of these materials.

The diazo resin must be soluble into water and insoluble into the organic solvent which is used for the coating of the intermediate layer or the softening thereof. When sulfate or zinc chloride salt of formalin condensate of p-diazodiphenylamine is used, the addition amount thereof should be 2 to 20 wt.%, preferably 4 to 12 wt.% of the water-soluble resin described above. The coloring agent may be selected in a wide range so long as it is a water-dispersible pigment, but it is required to have a good miscibility with the water-soluble resin and the diazo resin described above and not to have adverse effects on the photosensitivity, the development property, etc. The addition amount of the coloring agent is preferable to be determined in order so that the optical transmission density of one layer of image formed becomes 0.3 to 1.5 therefor. The amount is dependent upon the kind of coloring agent, coating weight of the photosensitive layer, kind of the supporter, etc. Moreover, the color tone of the coloring agent may be selected to meet the purpose of the use. Besides, sufficient consideration is necessary as to the dispersion of the pigment used as the coloring agent. For example, the particle diameter is preferable to be as small as possible from the points of the resolution etc. Although water-soluble dyes were tested as the coloring agents, they showed, in general, poor compatibility with the components of the photosensitive layer, particularly, with the diazo resin and further lowered the photocrosslinking ability and the preservative stability due to the effects of many kinds of added inorganic salts etc. contained therein. Moreover, since there were many problems in that the photocrosslinked area was apt to be dissolved out with water at the time of the developement under the influence of the dye contained, that the light-fastness was poor, and the like, they were unsuitable for use as the coloring agents of the invention.

Besides the components described above, stabilizers for the prevention of the dark reaction, leveling agents for the improvement in the coating runnability when the photosensitive layer is provided on the supporter or the intermediate layer, defoamers, surfactants, etc. can be added to the photosensitive layer, if necessary. Moreover, upon providing said colored layer, the aforementioned components are mixed principally after dissolved or dispersed into water, but, for the purpose of improvement in the defoaming and the coating runnability, water-soluble organic solvents such as alcohols etc. can also be used as a part of the diluent if need be. The thickness of said photosensitive layer is preferable to be as thin as possible from the point of the image reproducibility, and is preferable to be a coated film thickness of 1 to 5$\mu$.

The intermediate layer used for the invention comprises the hydrophobic, water-resistant and organic solvent-softenable resin, and further the addition of the pigment is possible. The resins for the intermediate layer described above can be used including different materials, as long as the solvent used for the coating thereof does not dissolve the components in the photosensitive layer before the photocrosslinking reaction, and the resins have at least one or more organic solvents which do not dissolve the photosensitive layer before and after the photocrosslinking reaction but soften said resin in the intermediate layer. For example, polyamide resin, polyvinyl acetate, polyvinylbutyrol, polyvinyl formal, etc. can be used by selecting i-propyl alcohol for the organic solvent to soften. Also, polyvinylidene chloride, copolymer of vinyl chloride with vinyl acetate, various cellulose derivatives, etc. can be used by selecting butyl acetate for the organic solvent to soften. Moreover, as the pigments to be used in the case of the addition thereof to the intermediate layer, such fine powders can be used that are insoluble into the organic solvent used for the softening of the intermediate layer, the solvent used for the coating of the resin for intermediate layer, and water, and show no reactivity with the compositions of the photosensitive layer and the intermediate layer. For example, by employing silica, titanium dioxide, clay, zinc oxide, barium sulfate, etc., excellent images can be obtained. The particle diameter of these pigments is preferable to be less than $2\mu$ from the point of the disolution, though not limited particularly.

Moreover, it is also possible to reproduce the color tone as a color mixture with the color tone of the upper or lower photosensitive layer of the intermediate layer by using colored pigments, and to extinguish the color tone of the lower photosensitive layer by hiding it with white pigments. However, the white pigments used should not be those which hinder the transmission of the active rays through the lower photosensitive layer to the highest degree. The addition amount of the pigment is preferable to be 10 to 100 wt.% of the resin used for the intermediate layer, though the amount is dependent upon the kind of the pigment, particle diameter, color tone, etc. The thickness of said intermediate layer is preferable to be as thin as possible from the points of the transmissivity of the active rays through the photosensitive layer, the reproducibility of the image, etc., and excellent images can be obtained with a coated film thickness of 0.3 to $4\mu$.

The multicolor image-forming material of the invention is made up by providing alternately the photosensitive layer and the intermediate layer comprising the composition of the former and that of the latter as described above, respectively, on the supporter which is, as the case may be, coated with the primer treatment agent, and by placing the photosensitive layer for the uppermost layer. Thereby, if too many photosensitive layers are provided, the image having already been formed on the upper layer is sometimes washed away during the treatment for the development of the lower photosensitive layer. In order to avoid this phenomenon, the coated photosensitive layers are preferable to be less than 5 layers. As the coating processes used for the application of the primer treatment agent, the composition of the photosensitive layer and the intermediate layer, all of the processes publicly known hitherto such as roll coating, reverse roll coating, dip coating, wire-wound bar coating, etc. can be applied, and there are no particular limitations so long as a uniform coating film is obtained.

The multicolor image-forming material of the invention can be used for the formation of images via the following processes.

(1) The uppermost photosensitive layer of the photosensitive coated face is exposed to light while contacted closely with a negative manuscript.

It is preferable if the light source used for the exposure has a spectral energy distribution that causes effectively the photocrosslinking reaction between the diazo resin and the water-soluble resin described above. Various types of mercury lamps, carbon arc lamps, xenon lamps, metal halide lamps, ultraviolet ray fluorescent lamps, etc. can be used.

(2) The uppermost photosensitive layer of the photosensitive coated face is washed with water and dried. The washing is performed by the use of shower of water of ordinary temperature jetting out from a nozzle under a pressure of less than 2 kg/cm$^2$. Washing may also be performed by rubbing off lightly with a sponge after immersing into water of ordinary temperature.

The drying is carried out in a warm current of air heated to a temperature lower than 80° C.

(3) The second photosensitive layer from the top of the photosensitive coated face is exposed through the upper intermediate layer just thereon while contacted closely with the negative manuscript.

(4) Immersion is made into an organic solvent which is capable of softening the resin in the intermediate layer.

The immersion time varys depending on the combination of the resin in the intermediate layer with the organic solvent. If the immersion time is too short, the washing for the development cannot be practiced in the next step (5), if too long, the image having already been formed on the upper layer is sometimes washed away. Besides, in this process, the surface of the intermediate layer may also be wetted with a sponge which is holding the organic solvent.

(5) The second photosensitive layer from the top of the photosensitive coated face and the upper intermediate layer just thereon are washed with water and dried.

The method for washing is same as that in (2). At this time, the non-exposed area (non-image area) on the second photosensitive layer from the top, which is contacted directly with the intermediate layer thereon, is washed to remove together with the upper intermediate layer except the image area having already been formed on the upper layer.

When more than three of the photosensitive layers are coated, process steps (3), (4) and (5) are repeated in sequence with regard to the third and the subsequent layers from the top of the photosensitive coated face.

The following examples will illustrate the invention more clearly, but the invention is not confined to the Examples.

EXAMPLE 1

A liquor (primer treatment liquor)

| | |
|---|---|
| Vinylidene chloride-acrylonitrile copolymer | 7 parts by wt. |
| Chlorinated ethylene-vinyl acetate copolymer | 3 parts by wt. |
| Methyl ethyl ketone | 50 parts by wt. |
| Toluene | 50 parts by wt. |

B liquor (photosensitive layer-forming liquor)

| Polyvinyl alcohol (average degree of polymerization 1700–2400, saponification degree 98.5 ± 0.5%), 10% solution | 100 parts by wt. |
| --- | --- |
| Condensate of p-diazodiphenylamine with formaldehyde | 0.8 parts by wt. |
| Pigment dispersion (20% aqueous dispersion of Permanent Carmine FB) | 4 parts by wt. |
| Water | 100 parts by wt. |
| Isopropyl alcohol | 10 parts by wt. |

C liquor (photosensitive layer-forming liquor)

| One obtained by replacing only the pigment dispersion with 20% aqueous dispersion of carbon black in the composition of B liquor. The pigment dispersion was obtained by dispersing for 3 hours with an ink mill using the following formulation | |
| --- | --- |
| Pigment | 60 parts by wt. |
| Nonionic surfactant (mainly polyethyleneglycol alkylphenyl ether) | 1 part by wt. |
| Water | 240 parts by wt. |

D liquor (intermmediate layer-forming liquor)

| Vinyl chloride-vinyl acetate copolymer (Denka Lac # 21, made by Denki Kagaku Kogyo Co.) | 9 parts by wt. |
| --- | --- |
| Silica | 1 part by wt. |
| Toluene | 95 parts by wt. |
| Ethyl acetate | 95 parts by wt. |
| The silica used was dispersed for 8 hour with ball mill using following formulation. | |
| Silica | 10 parts by wt. |
| Vinyl chloride-vinyl acetate copolymer | 4 parts by wt. |
| Toluene | 43 parts by wt. |
| Ethyl acetate | 43 parts by wt. |

On one side of a supporter of a thickness of 100μ, which had been obtained by laminating polyethylene to a thickness of each 20μ on both sides of paper of a thickness of 60μ, was coated A liquor with a roll coater. The supporter was then dried for 1 minute at 100° C. to perform the primer treatment with a dried film thickness of about 1μ. Then, B liquor was coated thereon with a wire-wound bar so as to form a dried film thickness of 2μ, and, after dried for 2 minutes at 80° C. with an air-blowing dryer, a photosensitive layer of magenta shade was formed. Further, D liquor was coated thereon with a wire-wound bar so as to form a dried film thickness of 1μ. This was dried for 1 minute at 80° C. with an air-blowing dryer to form the semitransparent intermediate layer. Furthermore, C liquor was coated thereon under the same conditions as used for B liquor so as to produce a dried film thickness of 2μ to form the black photosensitive layer. Thus, the two-color image-forming material was obtained.

Next, the photosensitive coated face of the two-color image-forming materials was closely contacted with a negative manuscript with letters forming sentences in which portions of the important words had fallen out. Exposure was performed for 60 seconds from a distance of 1 m by using an extra high voltage mercury lamp of 2 KW. Thereafter, the non-exposed area (non-image area) was dissolved out to develop with water of ordinary temperature jetting out from a nozzle at a pressure of 1.5 kg/cm². Thereafter it was drained, dried and in a warm current of air heated to 70° C. to form the image of black letters on the black photosensitive layer. Further, the intermediate layer of the photosensitive coated face is connected with a negative manuscript with letters comprising only the portions of the missing important words in the abovementioned sentences and exposure was given for 30 seconds under the same exposing conditions. Then, this was immersed for 5 seconds into butyl acetate, and the non-image area was dissolved out to develop rapidly with water under the same conditions as described above. At this time, the upper intermediate layer contacted with the non-image area was removed simultaneously, but the non-image area of the portion, the black image having already been formed on the upper layer thereof was not dissolved out, and the upper black image layer and the intermediate layer of the portion were also not washed away. After drying a magenta image was formed on the magenta photosensitive layer. In this manner, the image of the letters in the sentences was obtained wherein the ordinary letters were of black shade and only the important portions were of magenta shade.

The material obtained according to this example could be utilized effectively as the multicolor character-proofing material in the field of the plate-making for printing.

EXAMPLE 2

E liquor (primter treatment liquor)

| Vinylidene chloride-acrylonitrile copolymer | 10 parts by wt. |
| --- | --- |
| Methyl ethyl ketone | 100 parts by wt. |
| Trichloroacetic acid | 2 parts by wt. |

F liquor (photosensitive layer-forming liquor)
One obtained by replacing only the pigment dispersion with 20% aqueous dispersion of Phthalocyanine Blue in the composition of B liquor On the mat surface of a polyethylene terephthalate film of a thickness f 75μ which had been given a sand mat finish by a sand-blasting method was coated E liquor with a roll coater. This was dried for 1 minute at 100° C. to obtain a dried film thickness of about 0.2μ. Following this, a photosensitive layer of cyan shade comprising F liquor, the intermediate layer comprising D liquor and the black photosensitive layer comprising C liquor were provided in sequence by the same methods and dried to the same film thicknesses as those in Example 1, respectively, to obtain the two-color image-forming material.

Next, by the same procedure as in Example 1, a street picture was exposed on the black photosensitive layer and the laying picture of water pipes was exposed on the cyan photosensitive layer. After the treatment for the image formation, the black street picture and the cyan laying picture were formed on a sheet of film. Thereby, the portions in which the line drawings of both pictures were superposed showed a color mixture of black and cyan because of the semitransparency of the intermediate layer, and the transmission density of the black image area and the cyan image area was 1.35 and 0.60, respectively (the image density was measured with transmission type densitometer DM-500 (made by Dainihon Screen Manufacturing Co.). Further, this was printed on a commercial diazo photosensitive paper used as the manuscript. As a result of the development, the street picture was reproduced deeply and the laying picture was reproduced lightly. Therefore, the distinction of both pictures was evident through the light and the shade.

The material obtained according to this example was able to be utilized widely and effectively in uses for drafting of design, mapping for surveys, etc. as an intermediate sensitized film having a drafting quality and capable of forming a two-color image.

EXAMPLE 3

G liquor (photosensitive layer-forming liquor)

| | |
|---|---|
| Polyacrylamide, 15% aqueous solution (viscosity, 20,000 cps at 20° C.) | 100 parts by wt. |
| Condensate of p-diazodiphenylamine with formaldehyde | 1 part by wt. |
| Pigment dispersion (20% aqueous dispersion of Permanent Yellow HR) | 12 parts by wt. |
| Water | 180 parts by wt. |
| Isopropyl alcohol | 20 parts by wt. |

H liquor (photosensitive layer-composing liquor)
    One obtained by replacing only the pigment dispersion with 20% aqueous disersion of Permanent Carmine FB in the composition of G liquor.

I liquor (photosensitive layer-composing liquor)
    One obtained by replacing only the pigment dispersion with 20% aqueous dispersion of PHthalocyanine Blue in the composition of G liquor.

J liquor (photosensitive layer-composing liquor)
    One obtained by replacing only the pigment dispersion with 20% aqueous dispersion of carbon black in the composition of G liquor.

K liquor (intermediate layer-forming liquor)

| | |
|---|---|
| Polyvinyl butyral (Eslec BM-S, Sekisui Kagaku Kogyo Co.) | 6 parts by wt. |
| Titanium dioxide | 4 parts by wt. |
| Toluene | 45 parts by wt. |
| Ethyl acetate | 45 parts by wt. |
| The titanium dioxide used was dispersed for 8 hours with a ball mill using the following formulation. | |
| Titanium dioxide | 30 parts by wt. |
| Polyvinyl butyral | 4 parts by wt. |
| Toluene | 33 parts by wt. |
| Ethyl acetate | 33 parts by wt. |

On sand mat film coated with the primer in Example 2 were coated G liquor, K liquor, H liquor, K liquor, I liquor, K liquor and J liquor in this order with a wirewound bar so as to obtain a dried film thickness of the photosensitive layer of 2$\mu$ and that of the intermediate layer of 0.8$\mu$. This was dried for 2 minutes at 80° C. in the case of the photosensitive layer and for 1 minute at 80° C. in the case of the intermediate layer with airblowing dryer to obtain the four-color image-forming material provided with the photosensitive layers colored in order of black, cyan, magenta and yellow from the top of the photosensitive coated face.

Next, four negative manuscripts of the arrangement picture of rooms for a building, the laying picture of the water pipes, the laying picture of the gas pipes and the wiring picture for the electrical system were prepared. First the manuscript of the arrangement picture of rooms was contacted closely with the photosensitive layer. This was exposed for 80 seconds from a distance of 1 m by using an extra high voltage mercury lamp of 2 KW. Thereafter, the non-exposed area was dissolved out to develop with water of ordinary temperature jetting out from a nozzle at a pressure of 1.5 kg/cm$^2$. It was thereafter drained and dried in a warm current of air heated to 70° C. to form the black arrangement picture of the rooms on the black photosensitive layer. Secondly, fitting the position to that of the black image of the arrangement picture of the rooms, the laying picture of the water pipes was contacted closely with the photosensitive layer through the intermediate layer, and the exposed for 40 seconds under the same conditions. This was rubbed off with a sponge allowed to hold isopropyl alcohol until the lower photosensitive layer appeared. After being dissolved out with water to develop and dried, the cyan image of the laying picture of water pipes was obtained on the cyan photosensitive layer. Following this, the image of the laying picture of the gas pipes was formed on the magenta photosensitive layer and that of the wiring picture for the electrical system was formed on the yellow photosensitive layer in turn with the exposure times of 30 seconds and 25 seconds, respectively, through the same treatment as that in the case of the cyan photosensitive layer to obtain the architectural draft for the design consisting of four colors. Thereby, since the hiding power of the intermediate layer was high, the color tone of the photosensitive layer having the image on the surface was not affected by the coloring agent in the lower layer, and the respective pictures were reproduced with the color tones of black, cyan, magenta and yellow, so that the differences were distinguished evidently.

The material obtained in accordance with this example could be utilized widely and effectively in the uses of drafting for design, mapping for surveys, etc. as an intermediate sensitized film having a drafting quality and capable of forming the four-color image.

EXAMPLE 4

In place of 15% aqueous solution of polyacrylamide used for the respective photosensitive layer-forming liquors in Example 3, 15% aqueous solution of acrylamidediacetone acrylamide copolymer (copolymerization ratio, 6:4, average degree of polymerization, 1000) was used with similar results.

What is claimed is:
1. A multi-color image forming material comprising multiple layers on a support, and having, at least two photosensitive layers, the farthest layer from the support being the uppermost photosensitive layer, the photosensitive layers being formed from a water-soluble resin having photocrosslinking ability with diazo resin, a photosensitive water soluble, organic solvent insoluble diazo resin, and a water dispersible coloring agent which can produce a color tone, each photosensitive layer having a coloring agent which can produce a different color tone; and at least one intermediate layer, each intermediate layer being positioned between each photosensitive layer and the next adjacent photosensitive layer, the intermediate layer being formed from a hydrophobic, water-resistant, organic solvent softenable resin.

* * * * *